(12) United States Patent
Banine et al.

(10) Patent No.: US 7,170,586 B2
(45) Date of Patent: Jan. 30, 2007

(54) LITHOGRAPHIC APPARATUS AND DEVICE MANUFACTURING METHOD

(75) Inventors: Vadim Yevgenyevich Banine, Helmond (NL); Levinus Pieter Bakker, Helmond (NL); Jeroen Jonkers, Aachen (DE); Erik Roelof Loopstra, Heeze (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 11/335,681

(22) Filed: Jan. 20, 2006

(65) Prior Publication Data

US 2006/0114441 A1    Jun. 1, 2006

Related U.S. Application Data

(63) Continuation of application No. 10/836,613, filed on May 3, 2004.

(51) Int. Cl.
*G03B 24/54* (2006.01)

(52) U.S. Cl. .......................... 355/67; 355/71; 378/34; 250/492.2

(58) Field of Classification Search ................... None
See application file for complete search history.

(56) References Cited

U.S. PATENT DOCUMENTS

| | | | | |
|---|---|---|---|---|
| 6,597,430 B1 * | 7/2003 | Nishi et al. | ................... | 355/53 |
| 2003/0223544 A1 * | 12/2003 | Murakami | .................. | 378/119 |

* cited by examiner

*Primary Examiner*—D. Rutledge
(74) *Attorney, Agent, or Firm*—Pillsbury Winthrop Shaw Pittman, LLP

(57) ABSTRACT

A lithographic apparatus includes an illumination system configured to provide a beam of radiation, a support configured to support a patterning device, a substrate table and a projection system. Furthermore, the lithographic apparatus includes a plurality of EUV sources for providing EUV radiation to the illumination system and a distributor which is arranged to convert the EUV radiation from each of the EUV sources into an intermediate beam of radiation. The intermediate beam of radiation is directed from the distributor in a first direction by a mirror surface. The distributor may include a rotationally driven mirror arrangement, the axis of rotation being non-parallel to the mirror surface.

21 Claims, 3 Drawing Sheets

LITHOGRAPHIC APPARATUS AND DEVICE MANUFACTURING METHOD

CROSS REFERENCE TO RELATED APPLICATIONS

This application is a continuation of U.S. application Ser. No. 10/836,613, filed May 3, 2004, the entire contents of which are incorporated herein by reference.

BACKGROUND OF THE INVENTION

1. Field of the Invention

The present invention relates to a lithographic apparatus and a device manufacturing method.

2. Description of the Related Art

A lithographic apparatus is a machine that applies a desired pattern onto a target portion of a substrate. Lithographic apparatus can be used, for example, in the manufacture of integrated circuits (ICs). In that circumstance, a patterning device, such as a mask, may be used to generate a circuit pattern corresponding to an individual layer of the IC, and this pattern can be imaged onto a target portion (e.g. including part of one or several dies) on a substrate (e.g. a silicon wafer) that has a layer of radiation-sensitive material (resist). In general, a single substrate will contain a network of adjacent target portions that are successively exposed. Known lithographic apparatus include steppers, in which each target portion is irradiated by exposing an entire pattern onto the target portion at once, and scanners, in which each target portion is irradiated by scanning the pattern through the projection beam in a given direction (the "scanning"-direction) while synchronously scanning the substrate parallel or anti-parallel to this direction.

Optical sources with wavelengths in the EUV (extreme ultra violet) range of 5 to 20 nm are currently being developed for use in lithography machines that can produce high resolution patterns for electronic devices or the like. Synchrotron radiation (SR) sources have been investigated as EUV radiation sources, but their output power is insufficient for use in EUV lithography. In addition, they are relatively large and expensive which makes them unattractive for practical applications. For this reason, substantial effort is being directed to the development of laser plasma (LP) and discharge plasma (DP) EUV sources. In the case of DP EUV sources, a target substance is situated or placed in the vicinity of electrodes between which an electric discharge is generated. This creates a plasma which generates EUV radiation. Currently, DP EUV sources are an attractive solution because of their simplicity and compactness of construction, low cost and relatively high efficiency, if compared to LP and SR EUV sources. The achievable output power of the DP EUV sources is limited by the heat load of the system, which is dominated by three heating effects. First, the combination of the large electrical current that passes through the plasma and the electrodes and the non-zero electrical resistance of the electrodes leads to heating of the electrodes. Furthermore, heat that is generated by the DP near the electrodes is irradiated to the electrodes and increases their temperature. Finally, the DP is generated in a high level of vacuum in order to minimize the loss of the EUV radiation. As a result, the generated heat cannot be transferred out of the system through thermal conductivity of a gas. These three factors limit the heat load of the DP EUV source and therefore the achievable output power to approximately 20–30 W, which is below the required power level for EUV lithography of 50–150 W. One possible way to increase the EUV output power is by bundling the EUV radiation from several individual EUV sources.

Such a bundled EUV source is known, for example, from U.S. Pat. No. 6,861,656, which describes a lithographic apparatus using an EUV source including a plurality of EUV sources. In that apparatus, a variable angle tilting mirror is used to combine the EUV radiation from multiple EUV pulse sources. The variable angle mirror is located downstream from the focusing-optical system and is coupled to a mirror-tilting mechanism to tilt the mirror by a respective angle corresponding to the particular beam from one of the individual EUV sources. The etendue of the EUV radiation of the composite beam is the same as the etendue of the individual EUV sources. This system can provide the required EUV power level, however, since the EUV sources are pulsed sources that operate at a repetition rate on the order of 10 kHz, the realization of a variable angle mirror that is synchronized with a plurality of pulse sources is a difficult challenge.

SUMMARY OF THE INVENTION

It is an aspect of the present invention to provide a lithographic apparatus including a simple and cost-effective solution to increase the output power of an EUV source by combining the output of a plurality of EUV sources.

According to an aspect of the present invention, a lithographic apparatus includes an illumination system configured to provide a beam of radiation; a support configured to support a patterning device, the patterning device configured to impart the beam with a pattern in its cross-section; a substrate table configured to hold a substrate; a projection system configured to project the patterned beam onto a target portion of the substrate; a plurality of radiation sources configured to provide radiation to the illumination system; and distributor configured to convert the radiation from each of the plurality of radiation sources into an intermediate beam of radiation, the intermediate beam of radiation being directed from the distributor in a first direction by a mirror surface, wherein the distributor includes a rotationally driven mirror arrangement including an axis of rotation being non-parallel to the mirror surface.

The distributor according to the present invention allows the combination of EUV power from a plurality of EUV pulsed sources by the rotationally driven mirror arrangement, which can be implemented in a very cost-effective and extremely reliable manner.

In a further exemplary embodiment, the radiation sources are pulsed EUV sources, and the plurality of EUV sources and the distributor are arranged to provide consecutive pulses in the first direction. In this exemplary embodiment, the rotationally driven mirror arrangement is used to temporally multiplex the EUV pulses from the plurality of different EUV pulsed sources and increase the total EUV output power.

In a still further exemplary embodiment of the present invention, the EUV pulsed sources are located in a circular fashion around the rotationally driven mirror arrangement and the same optical alignment system can be used to align the plurality of EUV pulse sources, thus facilitating the minimization of the physical size of the lithographic apparatus.

In a still even further exemplary embodiment, the axis of rotation of the rotationally driven mirror arrangement substantially coincides with the first direction. This allows an efficient use of the available space for the radiation source in the lithographic apparatus.

In yet another exemplary embodiment, the distributor includes a flat mirror assembly, the mirror surface intersecting the axis of rotation. In this case only one mirror aligns two or more different EUV pulse sources and enables the total output power provided to the illumination system to be increased without changing the etendue. This is possible, for example, when the rotationally driven mirror arrangement is a mirror located on a rotating prism, or a mirror formed by a rotating prism.

In a further exemplary embodiment of the present invention, the distributor includes a plurality of mirrors mounted on a rotating drum. Such a drum with a plurality of mirrors allows the rotational speed of the rotationally driven mirror arrangement to be significantly lower, if compared to the repetition rate of the EUV pulsed sources enabling, for example, easier synchronization of the position of each mirror with the corresponding EUV pulsed source.

The rotationally driven mirror arrangement may, in a further embodiment, include a plurality of mirrors mounted a predetermined distance from the axis of rotation of the rotating drum. The plurality of mirrors may, for example, be mounted on the outside surface of a solid disc, or between two flat discs.

In a further embodiment, the mirror surface includes a multilayer mirror, which is a well known and widely used, and therefore practical, mirror technology for lithography.

Alternatively, the mirror surface includes a grazing incidence mirror in a further embodiment which offers both a higher maximum acceptance angle and a higher reflectivity, which would result in a more efficient combination of the EUV light pulses.

In a further embodiment, a collector is provided for each of the EUV sources. The collector is arranged to collect the radiation from an EUV source in an intermediate focus point on the mirror surface. This allows combining the output of the individual EUV pulsed sources without increasing the etendue of the composite EUV pulsed source, if compared to the etendue of each of the individual EUV pulsed sources. This is desirable, compared to spatially multiplexed EUV pulsed sources where the etendue increases. In addition, in this embodiment, the size of the mirrors, and consequently the size of the mirror arrangement, can be minimized.

According to a further aspect of the invention, there is provided a device manufacturing method including providing a beam of radiation using an illumination system; patterning the beam in its cross-section; projecting the patterned beam of radiation onto a target portion of the substrate; providing radiation to the illumination system using a plurality of radiation sources; distributing the radiation from each of the plurality of EUV sources into an intermediate beam of radiation, the intermediate beam of radiation being directed in a first direction; and distributing the radiation from each source by a mirror surface positioned on a rotationally driven mirror arrangement including a rotation axis non-parallel to the mirror surface.

In a further embodiment, the radiation sources are pulsed EUV sources, and the method further includes driving the rotationally driven mirror arrangement synchronized with the pulsed EUV sources to provide consecutive pulses in the first direction. This method allows increasing the total EUV output power by time multiplexing the output of the individual EUV pulsed sources without increasing the etendue.

The method includes, in a further embodiment, rotating the rotationally driven mirror arrangement on an axis of rotation which substantially coincides with the first direction. This allows the rotation of the mirror arrangement with constant rotational speed which simplifies the drive control and the synchronization of the mirror arrangement with respect to the repetition rate of the EUV pulsed sources.

In a further embodiment, the method includes distributing the EUV radiation from each EUV source by a rotating drum having a plurality of mirror surfaces, in which each of the mirror surfaces converts the EUV radiation from one of the plurality of EUV sources in the first direction. Such a method allows the rotational speed of the rotating mirror arrangement to be significantly lower with respect to the repetition rate of the EUV pulsed sources enabling, for example, further easier synchronization of the position of each mirror with the corresponding EUV pulsed source.

The method includes, in a further embodiment, concentrating the radiation from each EUV source in an intermediate focus point on the mirror surface. The size of the mirror arrangement can be minimized by this method.

Although specific reference may be made in this text to the use of lithographic apparatus in the manufacture of ICs, it should be appreciated that the lithographic apparatus described herein may have other applications, such as the manufacture of integrated optical systems, guidance and detection patterns for magnetic domain memories, liquid-crystal displays (LCDs), thin-film magnetic heads, etc. It should be appreciated that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of 365, 248, 193, 157 or 126 nm) and extreme ultra-violet (EUV) radiation (e.g. having a wavelength in the range of 5–20 nm), as well as particle beams, such as ion beams or electron beams.

The term "patterning device" used herein should be broadly interpreted as referring to a device that can be used to impart a projection beam with a pattern in its cross-section such as to create a pattern in a target portion of the substrate. It should be noted that the pattern imparted to the projection beam may not exactly correspond to the desired pattern in the target portion of the substrate. Generally, the pattern imparted to the projection beam will correspond to a particular functional layer in a device being created in the target portion, such as an integrated circuit.

Patterning devices may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. In this manner, the reflected beam is patterned.

The support supports, e.g., bares the weight of, the patterning device. It holds the patterning device in a way depending on the orientation of the patterning device, the design of the lithographic apparatus, and other conditions, such as for example whether or not the patterning device is held in a vacuum environment. The support can be use mechanical clamping, vacuum, or other clamping techniques, for example electrostatic clamping under vacuum conditions. The support may be a frame or a table, for example, which may be fixed or movable as required and which may ensure that the patterning device is at a desired position, for example with respect to the projection system. Any use of the terms "reticle" or "mask" herein may be considered synonymous with the more general term "patterning means".

The term "projection system" used herein should be broadly interpreted as encompassing various types of projection system, including refractive optical systems, reflective optical systems, and catadioptric optical systems, as appropriate for example for the exposure radiation being used, or for other factors such as the use of an immersion fluid or the use of a vacuum. Any use of the term "lens" herein may be considered as synonymous with the more general term "projection system".

The illumination system may also encompass various types of optical components, including refractive, reflective, and catadioptric optical components for directing, shaping, or controlling the projection beam of radiation, and such components may also be referred to below, collectively or singularly, as a "lens".

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein the substrate is immersed in a liquid having a relatively high refractive index, e.g. water, so as to fill a space between the final element of the projection system and the substrate. Immersion liquids may also be applied to other spaces in the lithographic apparatus, for example, between the mask and the first element of the projection system. Immersion techniques are well known in the art for increasing the numerical aperture of projection systems.

BRIEF DESCRIPTION OF THE DRAWINGS

Embodiments of the present invention will now be described, by way of example only, with reference to the accompanying schematic drawings in which corresponding reference symbols indicate corresponding parts, and in which.

DETAILED DESCRIPTION

Figure 1:
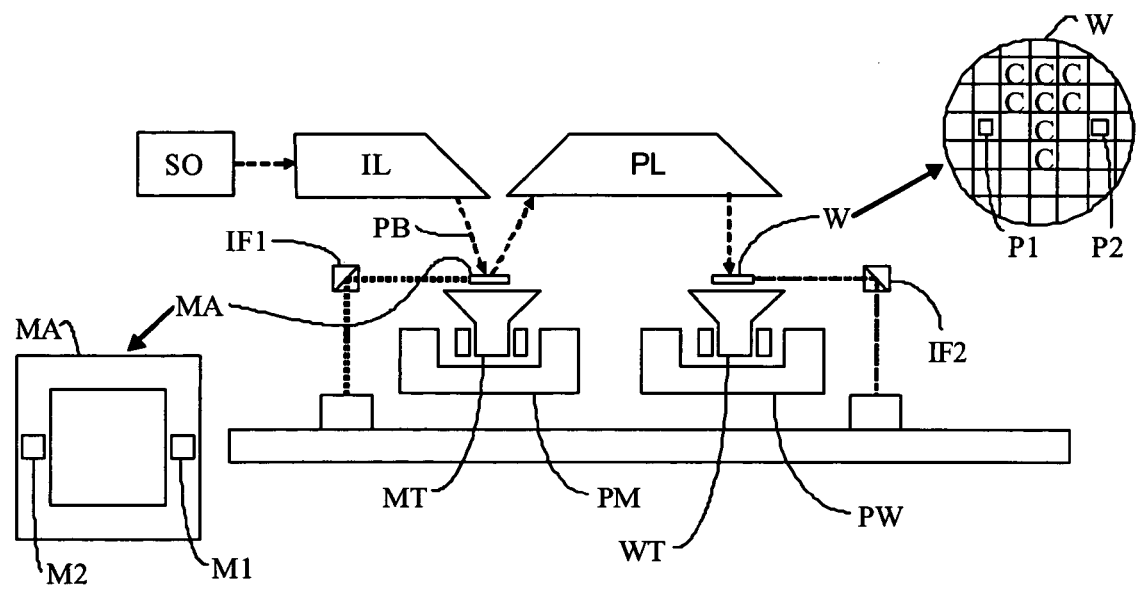
FIG. 1 schematically depicts a lithographic apparatus according to an embodiment of the present invention.

FIG. 1 schematically depicts a lithographic apparatus according to an embodiment of the present invention, including an illumination system (illuminator) IL configured to provide a beam PB of radiation (e.g. UV or EUV radiation). A first support structure (e.g. a mask table) MT is configured to support a patterning device (e.g. a mask) MA and is connected to first positioning device PM that accurately positions the patterning device with respect to a projection system ("lens") PL. A substrate table (e.g. a wafer table) WT is configured to hold a substrate (e.g. a resist-coated wafer) W and is connected to a second positioning device PW that accurately positions the substrate with respect to the projection system PL. The projection system (e.g. a reflective projection lens) PL is configured to image a pattern imparted to the beam PB by the patterning device MA onto a target portion C (e.g. including one or more dies) of the substrate W.

As here depicted, the apparatus is of a reflective type (e.g. employing a reflective mask or a programmable mirror array of a type as referred to above). Alternatively, the apparatus may be of a transmissive type (e.g. employing a transmissive mask).

The illuminator IL receives radiation from a radiation source SO. The source and the lithographic apparatus may be separate entities, for example when the source is a plasma discharge source. In such cases, the source is not considered to form part of the lithographic apparatus and the radiation is generally passed from the source SO to the illuminator IL with the aid of a radiation collector, including for example suitable collecting mirrors and/or a spectral purity filter. In other cases the source may be a part of the apparatus, for example when the source is a mercury lamp. The source SO and the illuminator IL may be referred to as a radiation system.

The illuminator IL may include an adjusting device configured to adjust the angular intensity distribution of the beam. Generally, at least the outer and/or inner radial extent (commonly referred to as σ-outer and σ-inner, respectively) of the intensity distribution in a pupil plane of the illuminator can be adjusted. The illuminator provides a conditioned beam of radiation PB having a desired uniformity and intensity distribution in its cross-section.

The beam PB is incident on the mask MA, which is supported by the mask table MT. Being reflected by the mask MA, the beam PB passes through the projection system PL, which focuses the beam onto a target portion C of the substrate W. With the aid of the second positioning device PW and a position sensor IF2 (e.g. an interferometric device), the substrate table WT can be moved accurately, for example, so as to position different target portions C in the path of the beam PB. Similarly, the first positioning device PM and a position sensor IF1 (e.g., an interferometric device) can be used to accurately position the mask MA with respect to the path of the beam PB, for example after mechanical retrieval from a mask library, or during a scan. In general, movement of the object tables MT and WT will be realized with the aid of a long-stroke module (coarse positioning) and a short-stroke module (fine positioning), which form part of the positioning devices PM and PW. However, in the case of a stepper (as opposed to a scanner) the mask table MT may be connected to a short stroke actuator only, or may be fixed. The mask MA and the substrate W may be aligned using mask alignment marks M1, M2 and substrate alignment marks P1, P2.

The depicted apparatus can be used in the following preferred modes:
1. In step mode, the mask table MT and the substrate table WT are kept essentially stationary, while an entire pattern imparted to the beam of radiation is projected onto a target portion C at once (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the beam is projected onto a target portion C (i.e. a single dynamic exposure). The velocity and direction of the substrate table WT relative to the mask table MT is determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
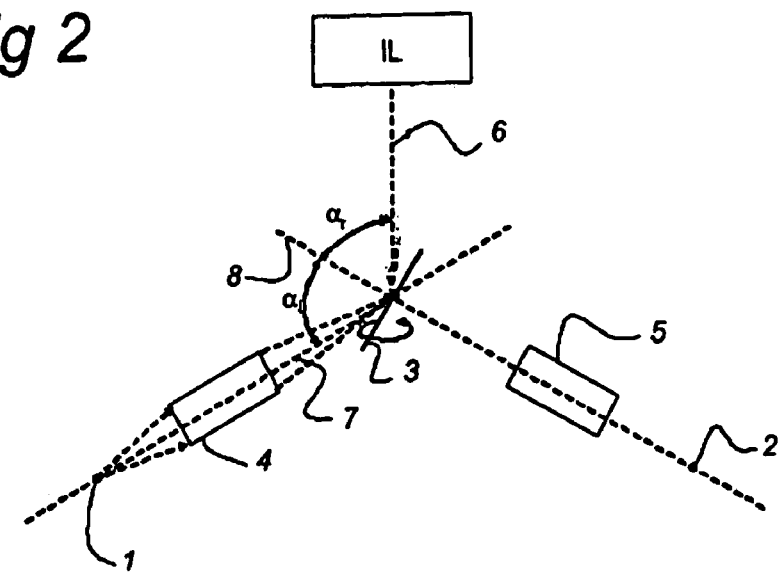
FIG. 2 is a schematic two-dimensional drawing of an optical arrangement of a distributor for EUV sources according to an embodiment of the present invention.

FIG. 2 is a schematic two-dimensional drawing of an optical arrangement of a distributor for EUV sources according to an exemplary embodiment of the present invention. Two EUV pulse sources 1 and 2 alternately produce EUV light pulses that propagate towards a rotationally driven mirror arrangement 3 configured to reflect the EUV pulses towards the illumination system IL. The EUV light sources 1 and 2 may, for example, be EUV point light sources that alternately produce EUV light pulses. Radiation from the EUV sources 1 and 2 travels to radiation collectors 4 and 5, respectively, for example suitable collecting mirrors, to produce an intermediate image of the source near the rotationally driven mirror arrangement 3. The rotationally driven mirror arrangement 3 rotates on an axis 6, which in the configuration shown coincides with the receiving axis of the illumination system IL, such that the EUV radiation from the individual sources 1 and 2 propagates to the illumination system IL after reflection by the rotationally driven mirror arrangement 3. The rotational speed and phase of the rotationally driven mirror arrangement 3 are synchronized with the repetition rate of the sources 1 and 2 so that the rotationally driven mirror arrangement 3 reflects, at the correct instant in time, each EUV light pulse coming from the EUV sources 1 and 2 in the direction of the illumination system IL. During the optical pulse from the source 1, the angle $\alpha_i$ between the trajectory 7 of the pulse coming from source 1 and the normal 8 of the rotationally driven mirror arrangement 3 is equal to the angle $\alpha_r$ between the normal 8 of the rotationally driven mirror arrangement 3 and the axis of rotation 6 to ensure that the incoming light pulse is reflected by the mirror 3 in the direction of the illumination system IL. Analogously, during the optical pulse from the source 2, the rotationally driven mirror arrangement 3 is rotated with 180° on the axis 6 with respect to the situation depicted in FIG. 2 and the EUV pulse from the source 2 is reflected to the illumination system IL.

In a further embodiment of the present invention, the EUV pulses from more than two sources that are positioned around the rotationally driven mirror arrangement are combined. The advantage of this method is that the required EUV power of the individual sources that is needed to achieve a certain total power at the input of the illumination system IL can be reduced. This results in a relaxed heat-load of the individual EUV pulse sources. A flat ML (multi-layer) mirror, the optical characteristics of which are well known, could be used for the rotationally driven mirror arrangement 3. Typical state-of-the-art flat ML mirrors offer a reflectivity of 60% for EUV radiation. However, if a flat ML mirror is used to reflect the EUV light pulses, significant losses could occur because the output of the state-of-the-art collector for EUV radiation is a cone with a top angle of 14° and a large part of this cone is outside the −7° to 7° region, where the ML reflectivity is high.

For the aforementioned reason, in a further embodiment of the invention a GI (grazing incidence) mirror can be used as the rotationally driven mirror arrangement 3. GI mirrors offer both a higher maximum acceptance angle (typically about 20°), and a higher reflectivity (typically about 80%), which results in a more efficient combination (i.e. lower loss) of the EUV light pulses. However, it is important to note that GI mirrors have to be larger than ML mirrors since the beam profile on a GI mirror is larger than on a ML mirror.

Figure 3A:
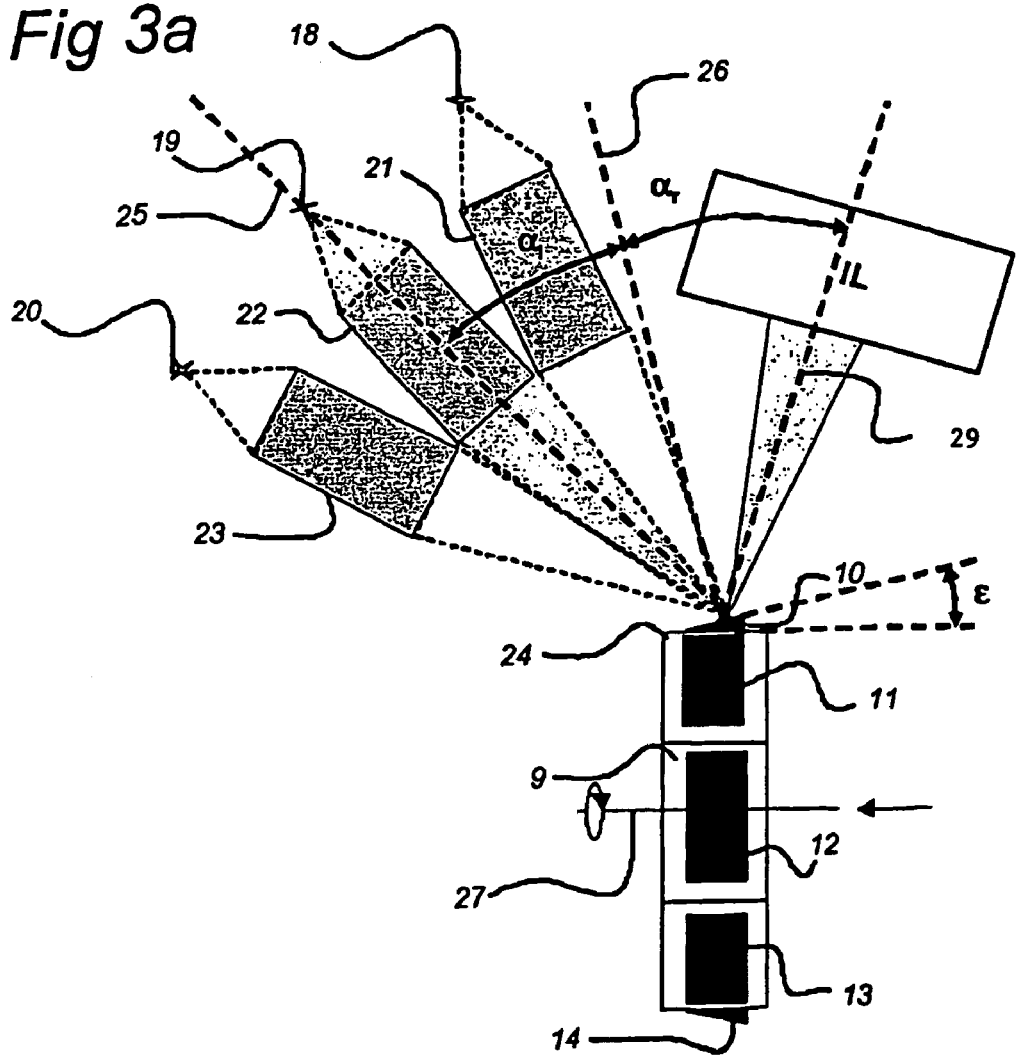
FIG. 3a is a schematic drawing of an exemplary embodiment of an optical system wherein the distributor includes a rotating drum with mirrors at its circumference.
Figure 3B:
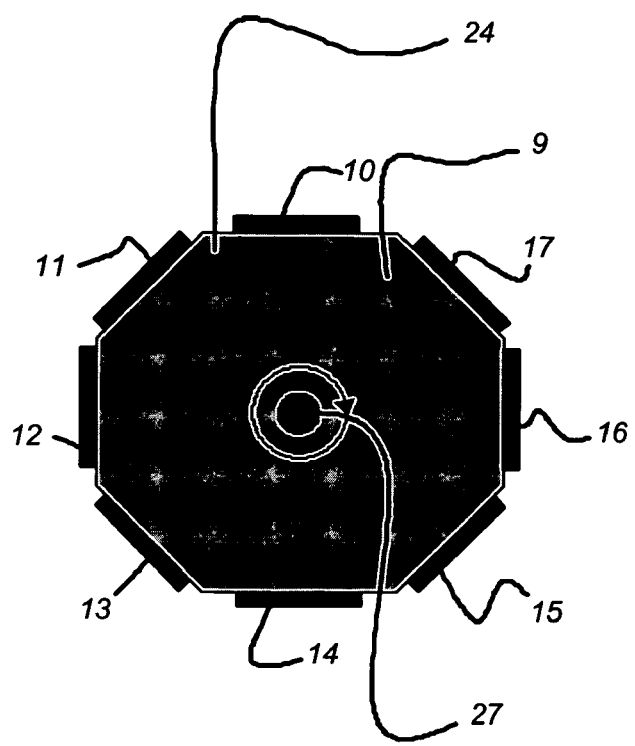
FIG. 3b is a schematic drawing of the drum of FIG. 3a perpendicular to its rotational axis.

FIG. 3a shows a simplified drawing of a further exemplary embodiment of an optical system where the distributor includes a rotating drum 9 with mirrors 10–17 at its circumference, and FIG. 3b shows the drum 9 perpendicular to the rotational axis 27 of the rotating drum 9. Three EUV pulse sources 18–20 alternately produce EUV light pulses that propagate towards the rotating drum 9 with mirrors 10–17 to reflect the EUV pulses towards the illumination system IL mounted at its circumference. The EUV pulse sources 18–20 include, for example, EUV point light sources that alternately produce EUV light pulses. Radiation from the EUV sources 18, 19, and 20 travels to radiation collectors 21, 22 and 23, respectively, to produce intermediate images of the EUV sources 18, 19 and 20, respectively, near the circumference of the rotating drum 9. During a light pulse from EUV the source 19, the mirror 10 is arranged at the IF (intermediate focus) point of the source 19 under an angle $\epsilon$ with an outer surface 24 of the drum 9, or preferably with the rotation axis 27 of the drum 9, which ensures that the angle $\alpha_i$ between the trajectory 25 of a light ray from the source to the mirror 10 and the normal 26 of the mirror surface is equal to the angle $\alpha_r$ between the trajectory 29 of a reflected light ray from the mirror 10 to the illumination system IL and the normal 26 to the mirror. At each rotation of the drum 9, a mirror 10–17 will come at an IF point of one of the collectors 21–23. The rotational speed and phase of the drum 9 are synchronized with the repetition rate of the sources 18–20 so that a mirror on the drum reflects, at the correct instant in time, each EUV light pulse coming from the EUV sources 18–20 in the direction of the illumination system IL. Although FIG. 3a is two-dimensional for simplicity, in a further embodiment of the present invention, the EUV pulses from multiple sources that are organized in a three-dimensional configuration, for example, nine sources in a 3×3 matrix, are reflected to the illumination system IL by mirrors on the rotating drum. Furthermore, although the mirrors 10–17 are arranged at the IF point of the corresponding collectors 21–23 in FIG. 3a, in a further embodiment, the mirrors may be arranged before or beyond the IF point of the sources.

It is also noted that the angle $\epsilon$ as presented in FIG. 3a may be positive or negative. When negative, the source will be positioned on the other side of the rotating drum 9. In this form, the rotating drum could also be used in the configuration shown in FIG. 2, in which the rotationally driven mirror arrangement 3 is one of the mirrors 10–17 on the outer surface of the rotating drum 9.

In a further embodiment of the present invention, multiple mirrors on the drum are associated with each of the EUV sources so that the number of mirrors on the rotating drum is a multiple of the number of sources. By doing this, the rotational frequency of the drum can be lower than the repetition rate of the sources. For example, if two EUV sources are used, mirrors with an area of $10\times10$ mm$^2$, and a radius of the rotating drum of 100 mm, in this case, 60 mirrors can be positioned on the circumference of the drum. For a total source repetition rate of 10 kHz, the rotational frequency will be 167 Hz, which is straightforward to achieve and allows accurate synchronization of the pulse sources and the mirror arrangement.

In a further embodiment of the invention, the mirrors for reflecting the EUV light could be mounted inside a drum which is open from the side. The mirror could be implemented as a ML mirror, since its characteristics are well known. The reflectivity of a state-of-the-art ML mirror is about 60% if the angle of incidence is within the acceptance angle of approximately 7°. However, significant losses would occur in case flat ML mirrors are used for reflecting the EUV light since the output of the state-of-the-art collector for EUV radiation is a cone with a top angle of 14° and a large part of this cone is outside the −7° to 7° region where the multilayer reflectivity is high. For this reason, the mirror could be implemented as a GI mirror, which has a larger acceptance angle (typically 20°) and higher reflectivity (typically 80%), compared to ML mirrors, resulting in a smaller loss of the EUV light. This can increase the total output power or reduce the output power of the individual EUV sources that is required to achieve a certain predetermined total output power. However, the cross section of the IF point on a GI mirror is larger than on ML mirrors due to the shallow angle between the mirror surface and the trajectory of the radiation beam that is incident on the mirror surface. However, this can be counteracted by using a plane parallel to the GI mirror and the rotational axis.

Figure 4:
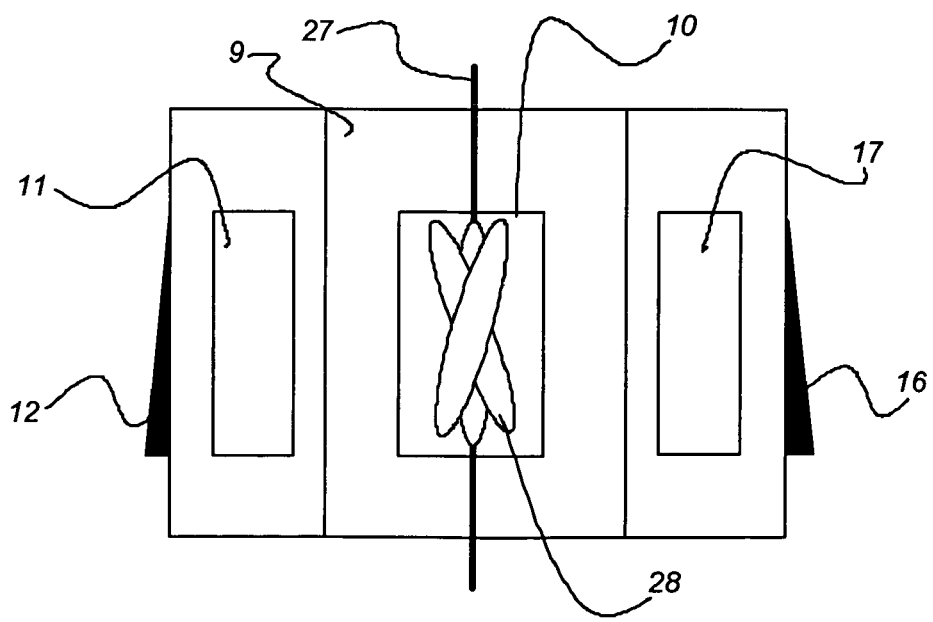
FIG. 4 is a schematic cross-section of the intermediate focus point from the three EUV sources of FIG. 3a on the rotating drum.

FIG. 4 shows an overlay 28 of the cross-section of the IF point produced on the circumference of the rotating drum 9 by the three collectors 21–23 of the corresponding EUV sources 18–20 that are shown in FIG. 3a. For example, at 7° mutual inclination the width of the mirror can be decreased from 2.4 cm to 1 cm if using ML mirrors instead of GI mirrors. As a result, the radius of the rotating drum 9 can be reduced which allows for a more cost-effective construction of the rotating drum. It should be understood that the sizes in this example are valid for discharge sources with a relatively large hot spot size. The same values for LP pulses might be smaller, e.g., 0.5 cm for ML mirrors and 1.9 cm for GI mirrors.

While specific embodiments of the invention have been described above, it will be appreciated that the invention may be practiced otherwise than as described. The description is not intended to limit the invention. For example, in the above embodiments, it is assumed that flat surface mirrors are being used, however, it would e.g. also be possible to use mirrors with a curved surface.

What is claimed is:

1. A lithographic apparatus, comprising:
an illumination system configured to provide a beam of radiation;
a support configured to support a patterning device, the patterning device configured to impart the beam with a pattern in its cross-section;
a substrate table configured to hold a substrate;
a projection system configured to project the patterned beam onto a target portion of the substrate;
a plurality of EUV radiation sources configured to provide EUV radiation to the illumination system; and
a distributor configured to convert the EUV radiation from each of the plurality of EUV sources into an intermediate beam of radiation, the intermediate beam of radiation being directed from the distributor in a first direction by a mirror surface, wherein each angle of incidence of the EUV radiation from each radiation source to a normal of the mirror surface is equal to each angle of reflection of the EUV radiation to the normal of the mirror surface, and the distributor comprises a rotationally driven mirror arrangement that comprises the mirror surface, the mirror surface intersecting an axis of rotation of the rotationally driven mirror arrangement.

2. A lithographic apparatus according to claim 1, wherein the plurality of EUV radiation sources are pulsed EUV sources, and the plurality of pulsed EUV sources and the distributor are configured to provide consecutive pulses in the first direction.

3. A lithographic apparatus according to claim 1, wherein the plurality of EUV sources are positioned in a circular arrangement.

4. A lithographic apparatus according to claim 1, wherein the axis of rotation of the rotationally driven mirror arrangement substantially coincides with the first direction.

5. A lithographic apparatus according to claim 1, wherein the distributor further comprises a rotating drum having a plurality of mirror surfaces, and each of the mirror surfaces is aligned to convert the EUV radiation from one of the plurality of EUV radiation sources in the first direction.

6. A lithographic apparatus according to claim 5, wherein the plurality of mirror surfaces are positioned at a predetermined distance from the axis of rotation of the rotating drum.

7. A lithographic apparatus according to claim 1, wherein the mirror surface comprises a multilayer mirror.

8. A lithographic apparatus according to claim 1, wherein the mirror surface comprises a grazing incidence mirror.

9. A lithographic apparatus according to claim 1, further comprising a collector provided for each of the EUV sources, the collector configured to collect radiation from an EUV source in an intermediate focus point on the mirror surface.

10. A device manufacturing method, comprising:
providing a beam of radiation using an illumination system;
patterning the beam of radiation in its cross-section;
projecting the patterned beam of radiation onto a target portion of the substrate;
providing EUV radiation to the illumination system using a plurality of EUV radiation sources;
converting the EUV radiation from each of the plurality of EUV sources into an intermediate beam of radiation; and
directing the intermediate beam of radiation in a first direction by a mirror surface, wherein each angle of incidence of the EUV radiation from each radiation source to a normal of the mirror surface is equal to each angle of reflection of the EUV radiation to the normal of the mirror surface, wherein the EUV radiation sources are pulsed EUV sources, and the method further comprises driving a rotationally driven mirror arrangement comprising the mirror surface synchronized with the pulsed EUV sources to provide consecutive pulses in the first direction; and rotating the rotationally driven mirror arrangement on an axis of rotation which substantially coincides with the first direction.

11. A device manufacturing method according to claim 10, wherein the rotationally driven mirror arrangement comprises a rotating drum having a plurality of mirror surfaces, the method further comprising distributing the EUV radiation from each EUV source by rotating the rotating drum, and each of the mirror surfaces converts the EUV radiation from one of the plurality of EUV radiation sources in the first direction.

12. A device manufacturing method according to claim 10, wherein the method further comprises concentrating the radiation from each EUV source in an intermediate focus point on the mirror surface.

13. A radiation system, comprising:
a plurality of EUV radiation sources configured to provide EUV radiation to the illumination system; and
a distributor configured to convert the EUV radiation from each of the plurality of EUV sources into an intermediate beam of radiation, the intermediate beam of radiation being directed from the distributor in a first direction by a mirror surface, wherein each angle of incidence of the EUV radiation from each radiation source to a normal of the mirror surface is equal to each angle of reflection of the EUV radiation to the normal of the mirror surface, and the distributor comprises a rotationally driven mirror arrangement that comprises the mirror surface, the mirror surface intersecting an axis of rotation of the rotationally driven mirror arrangement.

14. A radiation system according to claim 13, wherein the plurality of EUV radiation sources are pulsed EUV sources, and the plurality of pulsed EUV sources and the distributor are configured to provide consecutive pulses in the first direction.

15. A radiation system according to claim 13, wherein the plurality of EUV sources are positioned in a circular arrangement.

16. A radiation system according to claim 13, wherein the axis of rotation of the rotationally driven mirror arrangement substantially coincides with the first direction.

17. A radiation system according to claim 13, wherein the distributor further comprises a rotating drum having a plurality of mirror surfaces, and each of the mirror surfaces is aligned to convert the EUV radiation from one of the plurality of EUV radiation sources in the first direction.

18. A radiation system according to claim 17 wherein the plurality of mirror surfaces are positioned at a predetermined distance from the axis of rotation of the rotating drum.

19. A radiation system according to claim 13, wherein the mirror surface comprises a multilayer mirror.

20. A radiation system according to claim 13, wherein the mirror surface comprises a grazing incidence mirror.

21. A radiation system according to claim 13, further comprising a collector provided for each of the EUV sources, the collector configured to collect radiation from an EUV source in an intermediate focus point on the mirror surface.

* * * * *